United States Patent

Ohya et al.

[11] Patent Number: 5,925,451
[45] Date of Patent: Jul. 20, 1999

[54] COMPOSITE CERAMIC BOARD AND PROCESS FOR THE PRODUCTIVITY THEREOF

[75] Inventors: Kazuyuki Ohya; Norio Sayama, both of Tokyo, Japan

[73] Assignee: Mitsubishi Gas Chemical Company, Inc., Tokyo, Japan

[21] Appl. No.: 08/938,614

[22] Filed: Sep. 26, 1997

[30] Foreign Application Priority Data

Sep. 30, 1996 [JP] Japan ..................... 8-259048

[51] Int. Cl.⁶ ............... B32B 3/26; B32B 5/18; B05D 7/22; C04B 35/64
[52] U.S. Cl. .............. 428/307.3; 264/628; 264/641; 264/643; 427/238; 427/294; 428/312.6; 428/315.7; 428/319.1; 428/319.3
[58] Field of Search ............... 428/307.3, 312.2, 428/312.6, 315.7, 319.3, 322.7, 337, 317.9, 319.1; 427/294, 238; 264/137, 628, 641, 643, 45.3

[56] References Cited

U.S. PATENT DOCUMENTS

| | | | |
|---|---|---|---|
| 3,688,832 | 9/1972 | Horton | 164/72 |
| 4,882,455 | 11/1989 | Sato et al. | 174/68.5 |
| 5,531,945 | 7/1996 | Ohya et al. | 264/60 |
| 5,686,172 | 11/1997 | Ohya et al. | 428/210 |

*Primary Examiner*—Blaine R. Copenheaver
*Attorney, Agent, or Firm*—Wenderoth, Lind & Ponack, L.L.P.

[57] ABSTRACT

A composite ceramic board having a low dielectric constant and a low heat expansion coefficient and being suitable for use as a heat-resistant material having a high dimensional accuracy and a low dielectric constant, which is formed of a sintered substrate (II) having a thickness of 0.2 to 10 mm and a thermosetting resin (R) which is integrated into the sintered substrate (II) by being impregnated into pores of the sintered substrate (II) under vacuum and cured, the sintered substrate (II) being a substrate obtained from an inorganic continuous porous sintered body (I) produced by sintering a spherical inorganic powder having an average particle diameter of 0.1 to 10 μm in the presence of a sintering aid, the sintered inorganic powder substantially retaining the spherical forms, the inorganic continuously porous sintered body (I) having an average pore diameter of 0.1 to 10 μm, a true porosity of 8 to 35% and a closed porosity of 2% or less.

6 Claims, No Drawings

COMPOSITE CERAMIC BOARD AND PROCESS FOR THE PRODUCTIVITY THEREOF

FIELD OF THE INVENTION

The present invention relates to a composite ceramic board remarkably improved in machinability, e.g., drillability and a process for the production thereof. In particular, it relates to a composite ceramic board which is suitable for use as a metal-foil-clad composite ceramic board in which a metal foil is strongly bonded to the composite ceramic board through a minimum amount of an adhesive layer.

BACKGROUND OF THE INVENTION

Ceramics have excellent physical properties such as a low heat expansion coefficient, high heat conductivity, electric insulation, and the like. A printed wiring board and other various products are produced and practically used by applying these excellent physical properties.

Since, ceramics generally have poor machinability, it is necessary to use a special machine or device and a high machining technique in order to manufacture a desired part from ceramics. The so-manufactured parts are therefore expensive, and the ceramics are therefore extremely limited in use.

A machinable ceramic has been therefore developed. The machinable ceramic is improved in machinability to a great extent depending upon the kinds of inorganic powders used, a combination thereof and an amount ratio thereof, while the improvement in machinability has its own limits. For example, it is generally difficult to cut the machinable ceramic to a relatively wide board having a thickness of about 1 mm or to drill holes at narrow pitches. Even if the above machining is possible, the produced part is fragile so that it is exceedingly limited in use, if it is used as is.

Further, the above machinable ceramic generally has pores. As a consequence, the defect thereof is that it suffers a great change in physical properties due to humidity absorption when used in usual environments.

On the other hand, attempts have been made in various ways to form copper-clad boards by using, as a substrate, of porous ceramic sintered substrates (U.S. Pat. No. 4,882,455, JP-A-64-82689 (=JP-B-3-50429)).

However, the above prior art references essentially require using a glass cloth in combination, or some other means, and describe nothing concerning the technique relating to a metal-foil-clad composite ceramic board obtained by impregnating a porous ceramic sintered substrate with a resin, placing a metal foil directly on the resin-impregnated substrate and laminate-molding the resultant set.

The present inventors already filed patent applications (U.S. Pat. No. 5,531,945, JP-A-6-152086, etc.) of inventions directed to a method in which an inorganic continuously porous sintered body (porous ceramic sintered substrate) is impregnated with a thermosetting resin to form a resin-composite ceramic and the resin-composite ceramic is sliced.

Further, in the course of subsequent studies of the above method, there were found a novel metal-foil-clad composite ceramic board and a process for the production thereof, in which a metal foil is strongly bonded to a composite ceramic board through a minimum amount of an adhesive layer by concurrently carrying out the bonding of the metal foil and the fabrication of the resin-composite ceramic layer, and a patent application therefor was filed (Japanese Patent Application No. 7-310568).

Meanwhile, the above composite ceramic board or metal-foil-clad composite ceramic board that is easily machinable with a fabricating machine used for a glass epoxy laminate is limited with regard to hardness and strength, as shown in the specification of the above patent application. For example, a sintered body of cordierite is studied in various ways since it can be produced at a relatively low cost and has a low heat expansion coefficient. Generally, however, the sintered body of cordietie is difficult to machine with a fabricating machine used for a glass epoxy laminate. Quartz is a material which has a dielectric constant of approximately 3.5 to 4 and a dielectric loss tangent of $10^{-4}$ or less and is feasible for use in the range of from a wave range of centimeter wave to millimeter wave. However, a sintered body of conventional porous quartz is hard and fragile, and it is difficult to machine even if it is hardened by impregnating it with a resin.

The present inventors have made diligent studies to overcome the above problems and have accordingly arrived at the present invention.

SUMMARY OF THE INVENTION

It is an object of the present invention to provide a composite ceramic board having excellent machinability and a process for the production thereof.

It is another object of the present invention to provide a process for the production of a composite ceramic board having excellent machinability without impairing the properties of ceramics such as a low heat expansion coefficient, a low dielectric constant, and the like.

According to the present invention, there is provided a composite ceramic board wherein a sintered substrate (II) having a thickness of 0.2 to 10 mm and a thermosetting resin (R), which is impregnated into pores of the sintered substrate (II) under vacuum and cured, are integrated, the sintered substrate (II) being a substrate obtained from an inorganic continuous porous sintered body (I) produced by sintering a spherical inorganic powder having an average particle diameter of 0.1 to 10 $\mu$m in the presence of a sintering aid, the sintered inorganic powder substantially retaining the spherical forms, the inorganic continuously porous sintered body (I) having an average pore diameter of 0.1 to 10 $\mu$m, a true porosity of 8 to 35% and a closed porosity of 2% or less.

According to the present invention, there is also provided a process for the production of a composite ceramic board, which comprises sintering a spherical inorganic powder having an average particle diameter of 0.1 to 10 $\mu$m in the presence of a sintering aid to obtain an inorganic continuously porous sintered body (I) having an average pore diameter of 0.1 to 10 $\mu$m, a true porosity of 8 to 35% and a closed porosity of 2% or less, the sintered inorganic powder substantially retaining the spherical forms, preparing a sintered substrate (II) having a thickness of 0.2 to 10 mm from the inorganic continuously porous sintered body (I), impregnating the sintered substrate (II) with a thermosetting resin (R) under vacuum to obtain a resin-impregnated sintered substrate (IIR), placing a metal foil or a release film on a surface of the substrate (IIR) and laminate-molding the resultant set.

DETAILED DESCRIPTION OF THE INVENTION

The present invention will be explained in detail hereinafter.

First, the inorganic continuously porous sintered body (I) used for the production of the composite ceramic board of the present invention is obtained by sintering a spherical inorganic powder alone or a combination of the spherical inorganic powder with an optional fibrous reinforcement in the presence of a sintering aid. And, the sintered inorganic powder substantially retains the spherical form which the inorganic powder had before sintered.

The fact that the sintered inorganic powder substantially retains the spherical form means the following. When the sintered inorganic powder is machined, e.g., drilled, cut or lapped, the used inorganic powder undergoes selective breaking (peeling) through a breakable sintered interface with a relatively small force without being broken, and the sintered inorganic powder is therefore easily machinable.

For producing the above sintered body, it is required to use spherical particles as a raw material powder, and the sintering is carried out under conditions where the form of the raw material powder is not destroyed to a great extent (the spherical particles are not completely fused to one other).

For example, the above sintered body is produced by a method in which a fused silica powder is mixed with an organosiloxane solution used in a process for producing quartz glass by a sol-gel method, the resultant viscous substance is formed into a gel-like substance with removing the solvent according to a sol-gel method and the gel-like substance is sintered by increasing the temperature thereof. In this method, a sintered body having a high porosity tends to be easily formed. For obtaining a sintered body having a desired porosity, preferably, the spherical particles as a raw material are mixed so as to achieve the closest packing, and the gel-like substance is pressed as required at the stage of increasing the temperature.

Further, the above sintered body is also produced by another method in which a casting composition containing an inorganic filler is prepared from a curable compound which is converted to an inorganic substance by sintering it. For example, a glass silicone resin, and optionally a solvent, (the casting composition) are cast in the form of a sheet, the solvent is removed, the cast composition is cured under heat and under pressure as required, and the composition is gradually sintered to form a sheet containing an inorganic substance alone.

In general, the inorganic continuously porous sintered body (I) obtained by any one of the above methods has a flexural strength of approximately 20 to 40 MPa, and it has small strength and is fragile.

When the flexural strength of the inorganic continuously porous sintered body (I) is too low, it is difficult to use the inorganic continuously porous sintered body in a subsequent step. In such a case, it is preferred to use a reinforcement of fiber filaments in combination in order to increase the strength. The fiber filaments are preferably filaments having a length of about 0.1 mm or less and a diameter of about 2 $\mu$m or less.

The present invention remarkably improves the strength of the above inorganic continuously porous sintered body (I) to a practically usable level by uniformly impregnating a resin into continuous pores of the inorganic continuously porous sintered body (I) and curing the resin.

When a portion which cannot be impregnated with the resin or a large mass of a resin portion is formed in the above impregnation with the resin, a composite ceramic portion and a ceramic portion impregnated with no resin or a portion formed of the resin alone differ from each other in strength and heat expansion coefficient, and the difference causes cracking in a heat cycle in particular.

In view of the above, preferably, the inorganic continuously porous sintered body (I) has an average porosity of 0.1 to 10 $\mu$m, preferably 0.2 to 6 $\mu$m, particularly preferably 0.3 to 3 $\mu$m, a true porosity of 8 to 35% and a closed porosity of 2% or less, preferably substantially nil. When glass balloons are used, a closed space in each balloon is not considered to be a closed pore.

The sintered body (II) having a thickness of 0.2 to 10 mm, used in the present invention, is obtained from the above inorganic continuously porous sintered body (I). The surface of the sintered body (II) is smoothened (lapped) to have a thickness accuracy, per a distance of 2 mm to 50 mm, of preferably within ±30 $\mu$m, particularly preferably within ±20 $\mu$m and a 10-point average surface roughness of 30 $\mu$m or less, preferably 20 $\mu$m or less, particularly preferably 10 $\mu$m or less.

The thermosetting resin (R) used in the present invention is preferably a resin which is cured without forming a byproduct, such as an addition-polymerizable thermosetting resin. In particular, a heat-resistant thermosetting resin is preferred, and an epoxy resin and a cyanato resin are preferred. The cyanato resin includes a cyanate-containing resin, a cyanate ester-epoxy resin, a cyanateester-maleimide resin and a cyanate ester-maleimide-epoxy resin. Further, the epoxy resin which is used as a component of a resin composition is preferably an aromatic hydrocarbon-formaldehyde resin-modified novolak-epoxy resin.

For the impregnation, the thermosetting resin (R) is preferably a resin which is in the form of a liquid at room temperature or is melted by heating and which has a low viscosity and does not show much change in viscosity at an impregnation temperature, such as a resin which shows a gelation time of at least 1 hour, preferably at least 2 hours, at an impregnation temperature. Further, preferred is a resin which is converted to a solid when the resin is cooled to a temperature around room temperature after the impregnation and when no preliminary reaction takes place under impregnation conditions, since the above resin has excellent shelf life and is easy to handle in the step of fabricating a copper-clad board.

In the present invention, the resin-impregnated sintered substrate (IIR) is produced by infusing the thermosetting resin (R), which is preferably melted and deaerated under vacuum, into the sintered substrate (II) in an ambient atmosphere under a pressure of 7 kPa or less, preferably 4 kPa or less, particularly preferably 0.7 kPa or less, carrying out the impregnation treatment for 10 minutes to 10 hours, preferably 15 minutes to 2 hours, taking out the impregnated sintered substrate, and preferably, solidifying the impregnation resin by cooling it. The sintered substrate (II) is impregnated after it is fully dried, and before use, it is surface-treated (impregnated with a coupling agent, and further calcined as required) for improving the surface affinity with the thermosetting resin (R).

Preferably, the amount of the resin adhering to the surface of the resin-impregnated sintered substrate (IIR) is as minimum as possible.

In the present invention, the impregnation resin of the resin-impregnated sintered substrate (IIR) does not require the B-staging which is carried out in the process for the production of a glass epoxy laminate, or the B-staging is rather not carried out.

The metal foil used in the present invention is selected from a copper foil, an aluminum foil, a nickel foil, a nickel-plated copper foil, a copper foil with a nickel-plated adhesive layer, an aluminum foil-attached thin copper foil, a metal sheet core-copper foil obtained by temporarily bonding copper foil(s) on one surface or both surfaces of an aluminum, iron or stainless steel sheet having a thickness of approximately 0.07 to 0.7 mm, a CC foil obtained by plating a surface of a thick copper foil having a thickness of approximately 30–100 $\mu$m with a thin layer of Cr having a thickness of approximately 5 μm, etc., for release and further plating it with copper having a thickness of approximately 5–10 μm, and others as required depending upon a purpose.

The metal foil which is surface-treated for bonding is preferably a metal foil having a small surface roughness, for example, a low-profile-treated metal foil having an Rz of about 7 μm or less, particularly preferably 5 μm or less, such as an aluminum core copper foil obtained by temporarily bonding a low-profile copper foil to one surface or both surfaces of an aluminum alloy having a thickness of 0.15 to 0.6 mm with a heat-peelable adhesive.

When the composite ceramic board has no cladding of a copper foil, a release film or sheet is used. Specifically, an aluminum film or sheet treated with a fluorine resin, or the like is used.

The sintered substrate (II) has a substantially constant thickness and a substantially constant size, and it substantially does not undergo any dimensional change except for a change based on a thermal expansion under laminate-molding conditions. However, the sintered substrate (II) is fragile so that it easily undergoes cracking.

For industrially reliably producing the composite ceramic board, therefore, it is required to use co-materials and tools for the laminate-molding, which are prepared by taking the above properties of the sintered substrate (II) into account. The above co-materials and tools include a cushiony frame having continuous pores to be placed around sides of the resin-impregnated sintered substrate (IIR), a laminate-molding frame (mold) in which the composite ceramic board is placed, a plate heater which is used for heating or gradual cooling as required, and a heat-resistant cushion having a high heat conductivity.

Further, the laminate-molding machine can be selected from a conventional multi daylight vacuum press designed for pressing under reduced pressure or vacuum, an autoclave, a vacuum packing press, etc.

The sintered substrate (II) is fragile so that it easily undergoes cracking due to an impact or an excessive bending stress. When the above laminate-molding machine is used, it is therefore necessary to take care not to load with pressing hot plates too fast or not to exert a non-uniform pressure due to non-uniform parallelism of pressing hot plates.

A frame is placed around sides of the sintered substrate (II) impregnated with the above-explained thermosetting resin (R), i.e., the resin-impregnated sintered substrate (IIR), and metal foils or release sheets are stacked on the resin-impregnated sintered substrate (IIR) one foil or sheet on one surface and the other on the other surface, to prepare a set. A plurality of sets are prepared in this manner, and these sets in number as required are placed one on another through a sheet of a metal such as iron having a flat and smooth surface, cushions are placed on both surfaces of the resultant stack of the sets one cushion on one surface and the other on the other surface, and the resultant stack is placed between hot plates and pressured under heat (laminate-molded). After the impregnation resin is cured, the pressure is released as required, and the stack is compulsorily cooled or allowed to cool, to obtain composite ceramic boards of the present invention.

In preferred laminate molding, the ambient atmosphere is pressure-reduced and deaerated with increasing a temperature, a pressure of 20 kPa or less, preferably 7 kPa or less is maintained for at least 5 minutes, then, a laminate molding pressure of 0.2 to 8 MPa, preferably 0.4 to 4 MPa is applied to discharge excessive resin, and the impregnation resin (R) is gelated and cured.

Preferably, the pressure-reduction and deaeration are carried out to attain a maximum degree of pressure reduction before the impregnation resin of the resin-impregnated sintered substrate (IIR) is melted. Further, the pressure-reduction and deaeration are carried out to a vacuum degree almost equivalent to that of impregnation under vacuum and a temperature almost equivalent to that of impregnation under vacuum.

After the impregnation resin is melted and after a laminate-molding pressure is loaded, the pressure reduction degree is lowered so as to prevent the vaporization of the impregnation resin, and carrying out the termination of the pressure reduction is not necessarily required. When the vaporization of the impregnation resin is observed, the pressure reduction is terminated. Preferably, further, the pressure reduction is initiated and completed before a temperature at which the curing reaction of the resin substantially starts is reached.

The laminate-molding is carried out both for discharging molten and flowing excessive resin to surrounds of the resin-impregnated sintered substrate (IIR) and for increasing the adhesion between the sintered substrate (IIR) and the metal foil(s) or allowing the resin-composite ceramic layer to exhibit its properties. The laminate-molding pressure is applied after a stage when volatile components have been substantially removed by the above pressure reduction and deaeration and the resin starts to be melted. Preferably, the deaeration is carried out for at least 5 minutes before the application of the pressure, and the pressure of the press is set in the range of from 0.2 to 8 MPa, preferably 0.4 to 4 MPa and applied by multi-step procedures as required.

The curing temperature is properly selected depending upon the kind of the impregnation thermosetting resin (R). In the present invention, the thermosetting resin (R) is selected from those resins which permit vacuum impregnation, and therefore, no catalyst is used or a very small amount of a catalyst is used. As a final curing temperature, therefore, it is preferred to select a temperature a little higher than generally employed temperatures.

EXAMPLES

The present invention will be explained with reference to Examples hereinafter.

Example 1

As an inorganic continuously porous sintered body (I), there was prepared a fused silica-based porous material having a thickness of 1.6 mm and a size of 75 mm×75 mm (bulk density 1.7, apparent density 2.2, porosity 25%, specific surface area 0.25 m$^2$/g, average pore diameter 5.8 μm, to be referred to as "SIG-1" hereinafter) obtained by sintering spherical fused silica having an average particle diameter of 5 μm.

A solution of 3.0 wt % of γ-glycidoxypropyltrimethoxysilane in methyl ethyl ketone (to be referred to as "Solution S1" hereinafter) was prepared.

SIG-1 was placed in a container and heated to 120° C. The container with SIG-1 in it was placed in a vacuum impregnator, the impregnator was pressure-decreased to 7 kPa or less at room temperature, and the container with SIG-1 in it was maintained for 15 minutes to dry SIG-1 under vacuum.

Then, Solution S1 was poured into the container, and the container with SIG-1 and solution S1 in it was maintained for 15 minutes at a pressure reduction degree close to a boiling point Solution S1 to impregnate SIG-1 under vacuum. Then, the impregnated SIG-1 was taken out.

The above impregnated SIG-1 was placed in a dryer, and dried under heat at 120° C. for 15 minutes to give SIG surface-treated with the surface treating agent.

70.0 Parts by weight of 2,2-bis(4-cyanophenyl)propane, 28.0 parts by weight of a xylene-formaldehyde resin-modified novolak.epoxy resin (epoxy equivalent 259, softening point 83° C., number average molecular weight 1,163, trade name: Tetrad G, supplied by Mitsubishi Gas Chemical Co., Inc.), 1.0 part by weight of a polybutadiene-modified epoxy resin (number average molecular weight 1,800, density 0.95–0.98 g/cm$^3$, epoxy addition amount 7.3 mol/molecule, supplied by Nippon Petrochemical Co., Ltd., trade name: Nisseki Polybutadiene E-1800-6.5), 1.0 part by weight of γ-glycidoxypropyltrimethoxysilane and 0.1 part by weight of imidazole (supplied by Shikoku Kasei K.K., trade name: C11Z-CN) were homogeneously melted and mixed to prepare a thermosetting resin composition (to be referred to as "Resin R1" hereinafter).

The above surface-treated SIG-1 was placed in an impregnation container, and the impregnation container with SIG-1 in it was placed in a vacuum impregnator. The impregnator was pressure-decreased to 0.66 kPa or less, the temperature inside the impregnator was increased to 110° C., and the impregnation container with SIG-1 in it was maintained at this temperature for 1 hour.

Further, the above Resin R1 was placed in a resin container in the vacuum impregnator, melted at 110° C. and pressure-decreased and deaerated for 10 minutes.

While the pressure reduction degree was maintained, the above Resin R1 was gradually charged into the impregnation container through a bottom of the container at 110° C. to carry out impregnation under vacuum for 30 minutes.

The SIG-1 impregnated with Resin R1 was taken out of the vacuum impregnator, resin on its surface was removed by dropping the resin and the Resin R1 was cured to give a resin-impregnated SIG-1.

The resin-impregnated SIG-1 was placed within the innerside of a paper frame which has a thickness of 1.9 mm. Rolled low-profile electrolytic copper foils having a thickness of 18 μm each were placed on both the surfaces of the above resin-impregnated SIG-1 with one foil on one surface and the other foil on the other surface, and aluminum plates having a thickness of 0.38 mm each were used to form a structure in which the SIG-1 with the two foils on it were sandwiched with the aluminum plate. The resultant set was placed between hot press plates, and brought into a state where the set was in contact with the hot press plates (with no pressure). The heating of the hot press plates and the pressure reduction of the ambient atmosphere were initiated, and when the resin-impregnated SIG-1 had a temperature of 120° C., the application of a pressure was initiated, and a pressure of 1.47 MPa was maintained.

When the resin-impregnated SIG-1 had a temperature of 140° C., the pressure reduction of the ambient atmosphere was terminated and opened to atmosphere, and the resin-impregnated SIG-1 was maintained at the above temperature for 15 minutes. Then, the resin-impregnated SIG-1 was temperature-increased up to 195° C., press-molded for 2 hours and allowed to cool to give a copper-clad composite ceramic board.

The above-obtained copper-clad composite ceramic board was measured for physical properties, and Table shows the results.

Example 2

60 Parts by weight of a silica-coated nitride aluminum powder (trade name: U033571.00, supplied by Dow Chemical) and 25 parts by weight of a fused silica powder (trade name: FB01, supplied by Denki Kagaku Kogyo) were used as ceramic raw materials. The ceramic raw materials were mixed with a solution of 15 parts by weight of a glass silicone resin (trade name: GR908, supplied by Showa Denko) in about 50 parts by weight of methyl ethyl ketone, and the mixture was kneaded with a kneading roll, and formed into a sheet with a press to give a green sheet having a thickness of about 2 mm.

The above green sheet was dried with air at room temperature, thermally cured with a hot press machine at 80° C. for 20 minutes, at 180° C. for 20 minutes and at 235° C. for 60 minutes, and allowed to cool under a pressure of 15 kg/cm$^2$ for 20 minutes and then under a pressure of 50 kg/cm$^2$ for 100 minutes.

The above-obtained cured sheet was temperature-increased in a muffle furnace from 25° C. to 750° C. at a rate of 8° C./minute, then, maintained at 750° C. for 10 minutes and allowed to cool.

As a result, a silica-aluminum nitride-based porous material having a thickness of 1.62 mm and a size of 125 mm×125 mm was obtained. Then, Example 1 was repeated except that the silica-aluminum nitride-based porous material was used in place. The so-obtained copper-clad composite ceramic board was measured for physical properties, and Table shows the results.

Example 3

28.1 Percent by weight of a bisphenol A type epoxy resin (trade name: Epikote 828, supplied by Yuka-Shell Epoxy K.K.), 25% by weight of a xylene-formaldehyde resin-modified novolak.epoxy resin (epoxy equivalent 259, softening point 83° C., number average molecular weight 1,163, trade name: Tetrad G, supplied by Mitsubishi Gas Chemical Co., Inc.), 45.1% by weight of methylhexahydro phthalic anhydride, 1.6% by weight of γ-glycidoxypropyltrimethoxysilane and 0.2% by weight of triethanolamine were mixed to obtain a thermosetting resin composition (to be referred to as "Resin R2" hereinafter).

A copper-clad composite ceramic board was obtained in the same manner as in Example 1 except that Resin R1 was replaced with Resin R2, and measured for physical properties. Table shows the results.

Example 4

50 Parts by weight of hollow microspheres of glass (trade name: Glass Microballoon GMXB-6707, supplied by Nippon Denki Glass, apparent gravity 0.75, material specific gravity 2.6, particle diameter 7 to 11 μm (average 8 μm)) and 20 parts by weight of aluminum borate whisker (trade name: Alubolex M-20, supplied by Shikoku Kasei, bulk density 0.1 to 0.2 g/cm$^3$, density 3.0 g/cm$^3$, average fiber length 10 to 30 μm, average fiber diameter 0.5 to 1.0 μm; $9Al_2O_3/2B_2O_3$) were used as ceramic raw materials, and the ceramic raw materials were mixed with a solution of 30 parts by weight of a glass silicone resin (trade name: GR908) in about 80 parts by weight of toluene and about 10 parts by weight of methyl ethyl ketone to form a slurry. The slurry was cast in the form of a sheet to give a green sheet having a thickness of about 2 mm.

The above green sheet was dried with air at room temperature, thermally cured with a hot press machine at 80° C. for 20 minutes, at 180° C. for 20 minutes and at 235° C. for 60 minutes, and allowed to cool under a pressure of 15 kg/cm$^2$ for 20 minutes and then under a pressure of 50 kg/cm$^2$ for 100 minutes.

The above-obtained cured sheet was temperature-increased in a muffle furnace from 25° C. to 750° C. at a rate of 8° C./minute, then, maintained at 750° C. for 10 minutes and allowed to cool.

As a result, a hollow glass-aluminum borate-based porous material having a thickness of 1.73 mm and a size of 125 mm×125 mm was obtained. Then, Example 1 was repeated except that the hollow glass-aluminum borate-based porous material was used in place. The so-obtained copper-clad composite ceramic board was measured for physical properties, and Table shows the results.

Physical properties shown in Table were based on the following methods.

1: Bulk density: JIS-C-2141
2: Water absorption ratio: JIS-R-1601
3: Dielectric properties: JIS-C-2141, measured at 1 MHz.
4: Thermal expansion coefficient: Measurement temperature range=room temperature→200° C.
5: Copper foil peel strength: according to JIS C 2141, A: normal state, B: after dipping for soldering at 260° C. for 5 minutes.
6: Heat resistance: A test piece having a size of 5 cm×5 cm was prepared, and a copper foil portion having a diameter of 25 mm was allowed to remain. The test piece was placed in a hot air dryer at 350° C. for 30 minutes and taken out. The test piece was observed for an appearance of a substrate surface and a swelling of the copper foil. The deterioration of the copper foil by oxidation was not taken into consideration.

TABLE

Physical properties of copper-clad composite ceramic board

| Item | Unit | Ex. 1 | Ex. 2 | Ex. 3 | Ex. 4 |
|---|---|---|---|---|---|
| Bulk density*1 | g/cm$^3$ | 1.9 | 2.7 | 1.9 | 0.92 |
| Water absorption ratio*2 | wt % | 0.03 | 0.05 | 0.04 | 0.05 |
| Bending strength | MPa | 44 | 41 | 42 | 48 |
| Dielectric constant*3 | | 3.36 | 5.8 | 3.8 | 1.71 |
| Dielectric loss tangent*3 | | 0.0017 | 0.0026 | 0.0035 | 0.0051 |
| Thermal expansion coefficient*4 | ×10$^{-6}$K$^{-1}$ | 3.8 | 6.8 | 4.3 | 11 |
| Heat conductivity | W(mk)$^{-1}$ | 1.8 | 26 | 1.9 | 0.8 |
| Copper foil peel strength*5 | A | 1.0 | 0.9 | 1.0 | 0.9 |
| | B | 1.2 | 1.0 | 1.1 | 1.1 |
| Heat resistance*6 | | A | A | A | A |

Ex. = Example, A = Defect-free

The composite ceramic board of the present invention shows a relatively low strength, while it has a low dielectric constant and a low heat expansion coefficient and is suitable for use as a heat-resistant material having a high dimensional accuracy and a low dielectric constant.

What is claimed is:

1. A composite ceramic board wherein a sintered substrate (II), having a thickness of 0.2 to 10 mm, and a thermosetting resin (R) which is impregnated into pores of the sintered substrate (II) under vacuum and cured, are integrated, the sintered substrate (II) is prepared from an inorganic continuous porous sintered body (I) produced by sintering a spherical inorganic powder having an average particle diameter of 0.1 to 10 μm in the presence of a sintering aid, the sintered inorganic powder substantially retaining the spherical forms, the inorganic continuously porous sintered body (I) having an average pore diameter of 0.1 to 10 μm, a true porosity of 8 to 35% and a closed porosity of 2% or less.

2. A composite ceramic board according to claim 1, wherein the composite ceramic board has a copper foil which has a surface roughness, Rz, of 7 μm or less, is surface-treated for bonding and is bonded to a surface of the composite ceramic board through an adhesive layer which has a thickness of 10 μm or less.

3. A process for the production of a composite ceramic board, which comprises sintering a spherical inorganic powder having an average particle diameter of 0.1 to 10 μm in the presence of a sintering aid to obtain an inorganic continuously porous sintered body (I) having an average pore diameter of 0.1 to 10 μm, a true porosity of 8 to 35% and a closed porosity of 2% or less, the sintered inorganic powder substantially retaining the spherical forms, preparing a sintered substance (II) having a thickness of 0.2 to 10 mm from the inorganic continuously porous sintered body (I), impregnating the sintered substrate (II) with a thermosetting resin (R) under vacuum to obtain a resin-impregnated sintered substrate (IIR), placing a metal foil or a release film on a surface of the substrate (IIR) to prepare a set and pressing the set under heat.

4. A process according to claim 3, wherein the spherical inorganic powder is selected from fused silica or glass balloons.

5. A process according to claim 3, wherein the spherical inorganic powder is sintered together with a reinforcement of fiber filaments having a diameter of 2 μm or less.

6. A process according to claim 3, wherein a metal foil is placed on substrate (IIR), said metal foil is copper foil which has a surface roughness, Rz, of 7 μm or less and is surface-treated for bonding.

* * * * *